US011683609B2

(12) United States Patent
Saha et al.

(10) Patent No.: US 11,683,609 B2
(45) Date of Patent: Jun. 20, 2023

(54) AMPLIFIER CIRCUIT FOR ENABLING POWER EFFICIENT AND FASTER PIXEL SETTLING IN IMAGE SENSORS

(71) Applicant: Samsung Electronics Co., Ltd., Suwon-si (KR)

(72) Inventors: Anurup Saha, West Bengal (IN); M Satya Chaitanya Chigatapu, Pradesh (IN); Madhusudan Govindarajan, Bangalore (IN); Ankush Chowdhury, Bengaluru (IN)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/567,348

(22) Filed: Jan. 3, 2022

(65) Prior Publication Data

US 2023/0022036 A1 Jan. 26, 2023

(30) Foreign Application Priority Data

Jul. 22, 2021 (IN) .............................. 202141033054

(51) Int. Cl.
*H04N 25/75* (2023.01)
*H03F 3/04* (2006.01)
(Continued)

(52) U.S. Cl.
CPC .............. *H04N 25/75* (2023.01); *H03F 3/04* (2013.01); *H04N 25/50* (2023.01); *H04N 25/709* (2023.01); *H04N 25/771* (2023.01)

(58) Field of Classification Search
CPC ...... H04N 25/75; H04N 5/378; H04N 25/709; H04N 5/3698; H04N 25/50; H04N 5/351; H04N 25/771; H04N 5/37452
See application file for complete search history.

(56) References Cited

U.S. PATENT DOCUMENTS 6,635,857 B1 10/2003 Kindt
7,289,149 B1 10/2007 Lee et al.
(Continued)

FOREIGN PATENT DOCUMENTS

WO WO-2017/212075 A2 12/2017
WO WO-2018/012316 A1 1/2018
WO WO-2019/235033 A1 12/2019

OTHER PUBLICATIONS

Ismail Cevik et al., "An Ultra-Low Power CMOS Image Sensor with On-Chip Energy Harvesting and Power Management Capability", Sensors 2015, 15, 5531-5554.

*Primary Examiner* — Nicholas G Giles
(74) *Attorney, Agent, or Firm* — Harness, Dickey & Pierce, P.L.C.

(57) ABSTRACT

A Complementary Metal Oxide Semiconductor (CMOS) Image Sensor (CIS), includes a pixel circuit, a VSL circuit, and an amplifier. The pixel circuit may generate a reset voltage and a signal voltage, based on a power supply connected to the pixel circuit and/or intensity of light captured by the pixel circuit. The VSL circuit may store pixel information in a pixel load based on settling a voltage at the pixel load to the signal voltage and/or set the voltage at the pixel load to a pixel reset voltage based on settling the voltage at the pixel load to the reset voltage. The amplifier may generate a voltage, based on varying a resistance at an input of the amplifier, to enable the VSL circuit to store the pixel information and/or set the voltage at the pixel load to the pixel reset voltage.

13 Claims, 3 Drawing Sheets

(51) Int. Cl.
    *H04N 25/50*     (2023.01)
    *H04N 25/709*     (2023.01)
    *H04N 25/771*     (2023.01)

(56) References Cited

U.S. PATENT DOCUMENTS

| | | | |
|---|---|---|---|
| 10,044,953 B2 * | 8/2018 | Okura | H04N 25/627 |
| 10,051,222 B2 | 8/2018 | Ito et al. | |
| 2002/0196352 A1 | 12/2002 | Boemler | |
| 2016/0373673 A1 * | 12/2016 | Okura | H04N 25/627 |
| 2020/0260041 A1 | 8/2020 | Sambonsugi | |

* cited by examiner

AMPLIFIER CIRCUIT FOR ENABLING POWER EFFICIENT AND FASTER PIXEL SETTLING IN IMAGE SENSORS

CROSS-REFERENCE TO RELATED APPLICATION

This application claims priority from Indian Patent Application No. 202141033054, filed Jul. 22, 2021 in the Indian Intellectual Property Office, and all the benefits accruing therefrom under 35 U.S.C. 119, the contents of which in its entirety are herein incorporated by reference.

BACKGROUND

Example embodiments herein relate to image sensors, and more particularly to an amplifier circuit included in an image sensor for providing a supply voltage, which reduces power consumption of the image sensor and reduces pixel settling time.

In Complementary Metal Oxide Semiconductor (CMOS) Image Sensors (CIS), pixel load contributes significantly to the total power consumption of analog circuits in the CIS. Each pixel (pixel voltage) is read during a reset phase (reset readout) and during a signal phase (signal readout). The reset readout phase and the signal readout phase can occur in cycles, wherein a sufficient time period needs to be allocated at each cycle for allowing the pixel voltage to settle at predefined voltage values prior to reset readout and signal readout respectively.

The time period depends on the difference between the pixel voltage value prior to the reset readout phase or the signal readout phase, and the predefined value at which the pixel voltage needs to settle during the reset readout or signal readout. The frame rate of the CIS can be impacted by the time period involved in the pixel voltage settling to the predefined value before the reset readout or signal readout. This time period can be referred to as settling time period. The frame rate increases when the settling time period is short and decreases when the settling time period is long. The settling of pixel voltage depends on a pixel load current, and power consumption of a CMOS Image Sensor depends on the magnitude of the pixel load current.

SUMMARY

Some example embodiments of the inventive concepts include an amplifier circuit for providing a configurable voltage supply to an image sensor for ensuring that voltages at pixel loads of the image sensor track (are close to) a pixel reset voltage before reset readout and signal readout, which allows reducing power consumption involved in pixel settling and allows increasing frame rate by reducing pixel settling time.

Some example embodiments of the inventive concepts provide the configurable voltage as an input to VSL source follower circuits in Analog to Digital (ADC) converters of the image sensor to ensure that the voltages at the individual pixel outputs of the image sensor are able to track the pixel reset voltage.

Some example embodiments of the inventive concepts connect a variable resistor at the input of the amplifier circuit to configure the voltage provided as the input to the source follower circuits, wherein the configured voltage provided is greater than a power supply voltage provided to pixel circuits of the image sensor.

Some example embodiments of the inventive concepts utilize the configurability of the voltage provided as the input to the source follower circuits of the ADC to tackle variations in the pixel reset voltage introduced by variable threshold voltages of the source follower circuits of the pixel circuits of the image sensor.

Some example embodiments of the inventive concepts set the voltages at the individual pixel loads of the image sensors close to the pixel reset voltage, prior to a signal/reset readout.

Some example embodiments of the inventive concepts provide an amplifier circuit for decreasing power consumption involved in pixel settling in an image sensor and increasing frame rate of the image sensor by reducing pixel settling time. Some example embodiments include decreasing the power consumption of the image sensor by ensuring that voltages at individual pixel loads of the image sensor track a pixel reset voltage. The pixel reset voltage is dependent on a power supply voltage, provided to pixel circuits of the image sensor, and threshold voltage of source followers in the pixel circuits of the image sensor. The frame rate of the image sensor can be increased without increasing the power consumption of the image sensor, as the voltages at the individual pixel loads of the image sensor are close to pixel reset voltage.

The image sensor includes a plurality of pixel circuits, a plurality of Analog to Digital Converters (ADCs), and the amplifier circuit. The pixel circuits capture light and convert the light into charge. Each of the ADCs includes a VSL circuit, which includes a pixel load, wherein the voltage at the pixel load is set to a reset voltage followed by a signal voltage in consecutive cycles. The cycles represent different rows of an image/frame. The plurality of ADCs represents different columns of a row of the image/frame. The plurality of ADCs set the voltage at the individual pixel loads to a control voltage before reset readout as well as signal readout (in parallel).

In some example embodiments, a Complementary Metal Oxide Semiconductor (CMOS) Image Sensor (CIS) may include a pixel circuit, a VSL circuit, and an amplifier. The pixel circuit may be configured to generate a reset voltage and a signal voltage, based on at least one of a power supply connected to the pixel circuit, or intensity of light captured by the pixel circuit. The VSL circuit may be configured to perform at least one of storing pixel information in a pixel load based on settling a voltage at the pixel load to the signal voltage, or setting the voltage at the pixel load to a pixel reset voltage based on settling the voltage at the pixel load to the reset voltage. The amplifier may be configured to generate a voltage to enable the VSL circuit to perform at least one of storing the pixel information, or setting the voltage at the pixel load to the pixel reset voltage. The generated voltage may be configured based on varying a resistance at an input of the amplifier.

Some example embodiments include determining a reset voltage, which is based on characteristics of source followers in the pixel circuits and the power supply voltages provided to the source followers of the pixel circuits. Prior to reset settling phase, the voltage at pixel output is determined by a control voltage. Thereafter, the SEL transistor in the pixel circuits are turned ON and the pixel load voltage is settled to the reset voltage from the control voltage. If the control voltage is close to the pixel reset voltage, the time period involved in settling the pixel load voltage to the reset settling voltage, from the control voltage, is reduced.

Some example embodiments include determining a signal voltage, which is based on an amount of charge at the input of the source followers of the pixel circuits and the power supply voltages provided to the source followers of the pixel circuits. The amount of charge at the input of the source followers depends on intensity of light captured by photodiodes at the input of the source followers. Prior to signal readout, when charge transfer happens from photodiode, the pixel output is set by a control voltage. Thereafter, the SEL transistor in the pixel circuits are turned ON and the pixel load voltage is settled to the signal voltage from the control voltage.

The control voltage can be approximated to the pixel reset voltage using a variable resistor connected at the input of the amplifier. The output voltage of the amplifier can be controlled based on the resistance of the variable resistor. The voltage provided at the inputs of the source followers of the ADCs is based on the output voltage of the amplifier. The control voltage is generated based on the voltage provided at the inputs of the source followers of the ADCs and the characteristics of the source followers. Therefore, the control voltage can be controlled using the variable resistor and can be configured to approximate the pixel reset voltage. The configurability of the control voltage also allows tracking variations in the source followers of the pixel circuits, which are capable of introducing variations in the pixel reset voltage.

These and other aspects of some example embodiments herein will be better appreciated and understood when considered in conjunction with the following description and the accompanying drawings. It should be understood, however, that the following descriptions, while indicating some example embodiments and numerous specific details thereof, are given by way of illustration and not of limitation. Many changes and modifications may be made within the scope of the inventive concepts herein without departing from the spirit thereof, and inventive concepts herein include all such modifications.

BRIEF DESCRIPTION OF THE DRAWINGS

Some example embodiments herein are illustrated in the accompanying drawings, through out which like reference letters indicate corresponding parts in the various figures. The example embodiments herein will be better understood from the following description with reference to the drawings, in which.

DETAILED DESCRIPTION

The example embodiments herein and the various features and advantageous details thereof are explained more fully with reference to some example embodiments that are illustrated in the accompanying drawings and detailed in the following description. Descriptions of well-known components and processing techniques are omitted so as to not unnecessarily obscure the example embodiments herein. The example embodiments used herein are intended merely to facilitate an understanding of ways in which the example embodiments herein may be practiced and to further enable those of skill in the art to practice the example embodiments herein. Accordingly, the example embodiments described with reference to the drawings should not be construed as limiting the scope of the example embodiments of the inventive concepts.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to, "about identical" to, "about the same" as, "about equal" to, "substantially identical" to, "substantially the same" as or "substantially equal" to the other elements and/or properties thereof. Elements and/or properties thereof that are about identical" to, "about the same" as, "about equal" to, "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same, equal, and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

It will be understood that elements and/or properties thereof described herein as being "about" the same, equal, and/or identical encompasses elements and/or properties thereof that have a relative difference in magnitude that is equal to or less than 10%. Further, regardless of whether elements and/or properties thereof are modified as "substantially" or "about," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Figure 1:
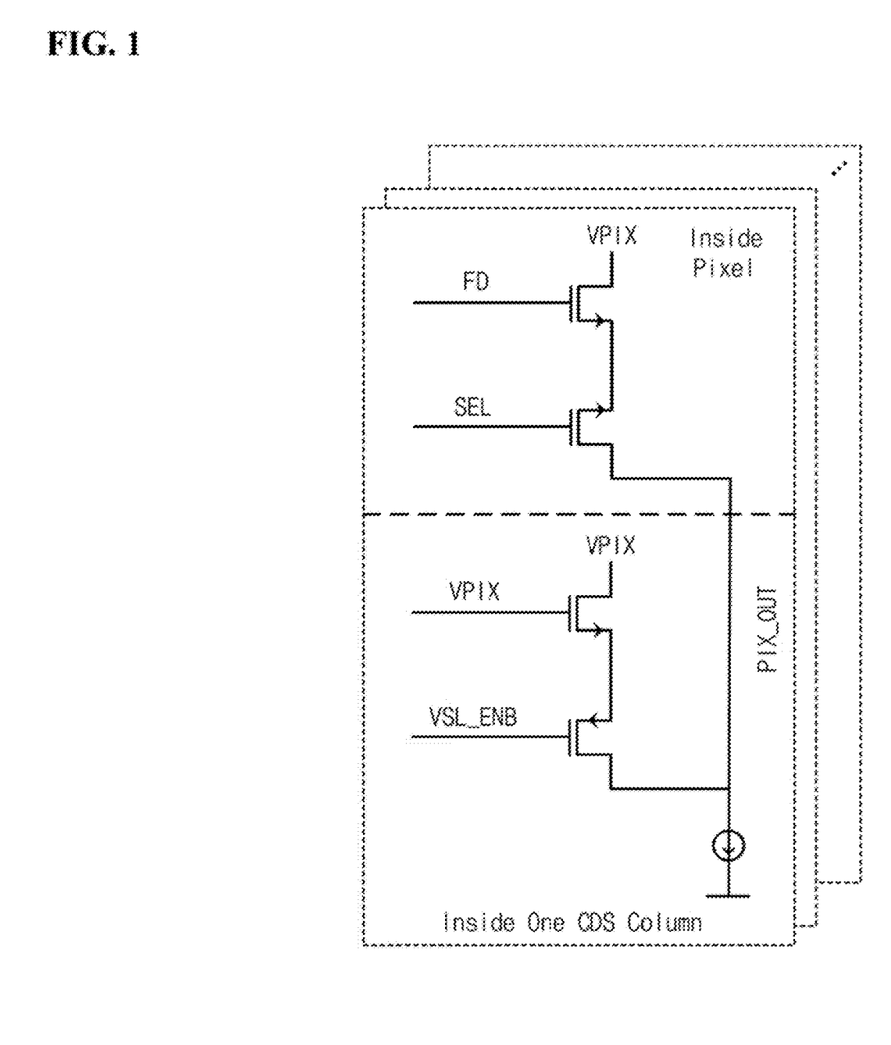
FIG. 1 depicts a pixel circuit and a coupled VSL circuit, which is inside a Correlated Double Sampling (CDS) column of a Complementary Metal Oxide Semiconductor (CMOS) Image Sensor (CIS) according to some example embodiments of the inventive concepts.

FIG. 1 depicts a pixel circuit and a coupled VSL circuit comprising a pixel load current source, which is inside a Correlated Double Sampling (CDS) column of a CIS according to some example embodiments of the inventive concepts. The voltage at output of pixel circuit is labelled as PIX_OUT. The pixel circuit and the VSL circuit includes two Metal Oxide Semiconductor (MOS) transistors each. The MOS transistors in the pixel circuit can be referred to as FD MOS transistor and SEL MOS transistor. The FD MOS transistor can be referred to as pixel source follower. The MOS transistors in the VSL circuit can be referred to as VPIX MOS transistor and VSL_ENB MOS transistor. The MOS transistors in the pixel circuit and the VSL circuit are fed with same power supply with a supply voltage VPIX.

The value of the voltage at the pixel load (PIX_OUT) needs to reach predefined values prior to reset readout and signal readout. The settling of the value of the voltage at the pixel load prior to reset readout can be considered as reset settling. The settling of the value of the voltage at the pixel load prior to signal readout can be considered as signal settling. Once reset settling or signal settling is achieved, i.e., value of the voltage at the pixel load is settled, reset readout or signal readout can be performed. After the reset readout or signal readout, the VPIX MOS transistor and VSL_ENB MOS transistor are turned ON and the SEL MOS transistor is turned OFF. As a result, the voltage at the pixel load reaches a particular value, which is dependent on the threshold voltage of the VPIX MOS transistor and the supply voltage VPIX. In an example, if the supply voltage VPIX is 2.8 Volts (V), then the voltage at the pixel load is approximately 2.1 Volts (V).

The pixel circuit includes a photodiode (not shown), which is connected to the gate terminal of the FD MOS transistor. The photo-diode can capture light and convert the light into charge. The charge is stored in (transferred from) a parasitic capacitance (not shown) at the gate terminal of the FD MOS transistor. Once the charge transfer is completed, signal settling is initiated. The signal settling can be initiated by switching ON the SEL MOS transistor. Prior to the capturing of light (by the photodiode), a certain amount of charge is stored in the parasitic capacitance at the gate terminal of the FD MOS transistor. This charge corresponds to a voltage, which can be referred to as reset voltage. The reset voltage is the voltage at the gate terminal of the FD MOS transistor. In an example, the voltage at the gate terminal of the FD MOS transistor (reset voltage) can be 2.8 V.

When the charge corresponding to the captured light is stored in the parasitic capacitance, the voltage at the gate terminal of the FD MOS transistor drops to a particular value based on the charge corresponding to the captured light. In an example, if the charge corresponding to the captured light corresponds to a voltage of 0.95 V, the voltage at the gate terminal of the FD MOS transistor can drop from 2.8 V to 1.85 V. In this example, the gain of pixel source follower is approximately 0.9. This necessitates the dropping of voltage at the pixel load by 0.85 V, i.e., from 2.45 V to 1.6 V. The signal settling involves settling the voltage at the pixel output to signal voltage (1.6 V). The signal readout involves reading the voltage at PIX_OUT, after switching ON the SEL MOS transistor.

Pixel information is directly proportional to the difference between the reset voltage and the signal voltage. Prior to reset readout or signal readout, the voltage at the pixel load needs to reach to 2.45 V from 2.1 V. The value of current at the pixel load can control the time period involved in causing the voltage at the pixel load to reach to 2.45 V from 2.1 V. In general, the value of current at the pixel load is inversely proportional to the time period involved in causing the voltage at the pixel load to reach to 2.45 V from 2.1 V. The power consumption of a CDS column is directly proportional to the pixel load current and the frame rate is inversely proportional to the time period.

Once the signal readout is completed, the VSL_ENB MOS transistor is switched ON and the SEL MOS transistor is switched OFF. The VSL_ENB MOS transistor is switched ON by providing an input (labelled as VSL_ENB). As the VSL_ENB MOS transistor is a p-type MOS transistor, the input is low (0). As the SEL MOS transistor is an n-type MOS transistor, the SEL MOS transistor is switching OFF by providing a low (0) input.

When reset readout is initiated, which involves reset settling and reset voltage conversion using Analog to Digital Converter (ADC), the voltage at PIX_OUT is 2.1V. The reset settling involves switching ON the SEL MOS transistor. As light is not captured during the reset readout phase, the voltage at the gate terminal of the FD MOS transistor reaches 2.8 V. The voltage at the pixel load needs to reach a pixel reset voltage, which is based on the voltage at the gate terminal of the FD MOS transistor (2.8 V for example) and properties of the FD MOS transistor. In an example, the pixel reset voltage can be 2.45 Volts (V) in Front side Deep Trench Isolation (FDTI) pixel technology. The voltage at the pixel load needs to reach to the pixel reset voltage during reset settling.

The reset settling involves switching ON the SEL MOS transistor. Once the SEL MOS transistor is switched ON, the voltage at pixel output can settle to a particular value from a value prior to the reset readout. To achieve higher frame rate, reset settling time needs to be reduced. One way of achieving faster reset settling is to increase pixel lead current.

After reset settling, reset readout is performed. After reset settling, the reset voltage is converted to digital output using ADC circuit. Once the reset readout is completed, the VSL_ENB MOS transistor is switched ON and the SEL MOS transistor is switched OFF. Thereafter, PIX_OUT voltage level goes to 2.1 Volts. Thereafter, another signal readout operation is performed after the photodiode captures light and converts the captured light into corresponding charge and voltage. This cycle continues until the signal values (pixel information) corresponding to all pixel rows has been determined. The pixel information for all CDS columns corresponding to each pixel column is determined at the same time, i.e., in parallel.

Some example embodiments herein disclose a Complementary Metal Oxide Semiconductor (CMOS) Image Sensors (CIS), which includes an amplifier circuit for providing a configurable voltage supply to VSL circuits of Analog to Digital Converters (ADCs) of the CIS. The configurable voltage supply allows reducing power consumption involved in pixel settling by ensuring that voltages at the pixel loads (pixel outputs) of the ADCs track a pixel reset voltage corresponding to pixel circuits of the CIS. The configurable voltage supply allows increasing frame rate of the CIS by reducing the time involved in pixel settling.

The amplifier circuit can generate the configurable voltage using a variable resistor. The variable resistor is connected at the input of the amplifier and the output voltage of the amplifier can be controlled by varying the resistance of the variable resistor. The voltage at the output of the amplifier is also dependent on the voltage provided by a power supply of the amplifier. The voltage provided at the input of a VSL source follower circuit of each ADC is dependent on the output voltage of the amplifier. A control voltage is generated at the pixel output based on voltage provided at the input of a VSL source follower circuit of each ADC and the characteristics of the source follower circuit. Therefore, the control voltage is controlled by the variable resistor and can be configured to approximate (e.g., be equal or substantially equal to, be about equal to, be close to, and/or to match) the pixel reset voltage.

The pixel reset voltage is dependent on voltage at the input of a source follower circuit in the pixel circuit and characteristics of the source follower circuit. The voltage at the input of source follower circuit is equal to a voltage provided by the power supply connected to the pixel circuit. Before reset settling, the voltage at pixel output is forced by a control voltage and after reset settling, the voltage at pixel output is equal to pixel reset voltage. So, the settling time depends on the difference of these voltages.

Each pixel circuit includes a photodiode, which is configured to generate charge from the light captured by the pixel circuit and store the generated charge in the parasitic capacitor at the input of source follower circuit of the pixel circuit. The amount of charge generated from the light is dependent on the intensity of the light captured by the pixel circuit. The signal voltage can vary based on the charge in the parasitic capacitor at the input of source follower circuit of the pixel circuit. Before signal readout, when SEL transistor is OFF, pixel output is held by a control voltage. Thereafter, the source follower circuit is turned ON and the pixel output voltage is settled to the signal voltage from the control voltage. The pixel information may be stored in the pixel load when the voltage at the pixel load settles to the signal voltage.

Figure 2:
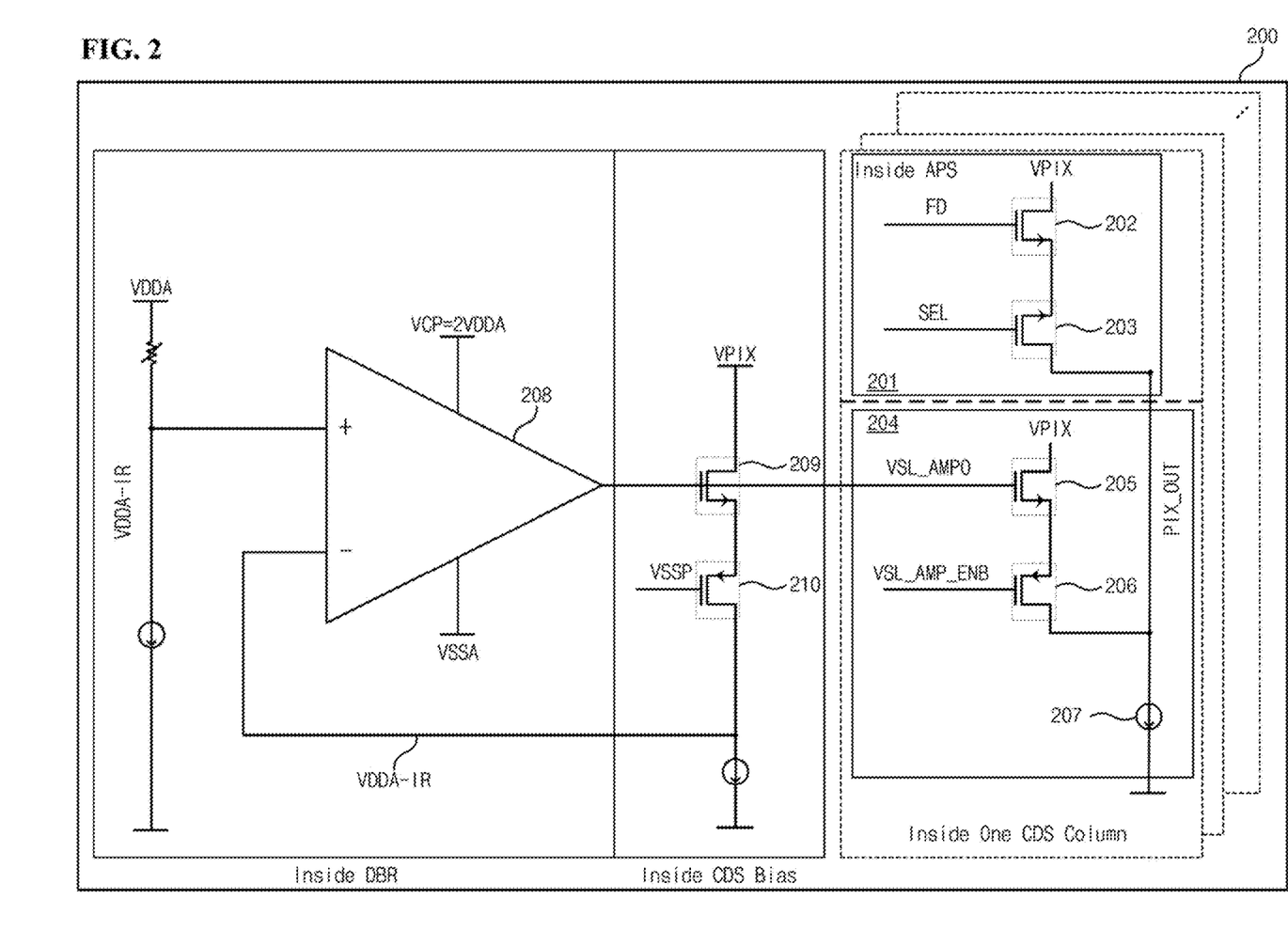
FIG. 2 depicts a CDS column of a CIS, coupled with an amplifier and a source follower, wherein the amplifier provides a configurable voltage to enable pixel load voltage to closely track a pixel reset voltage, according to some example embodiments of the inventive concepts.
Figure 3:
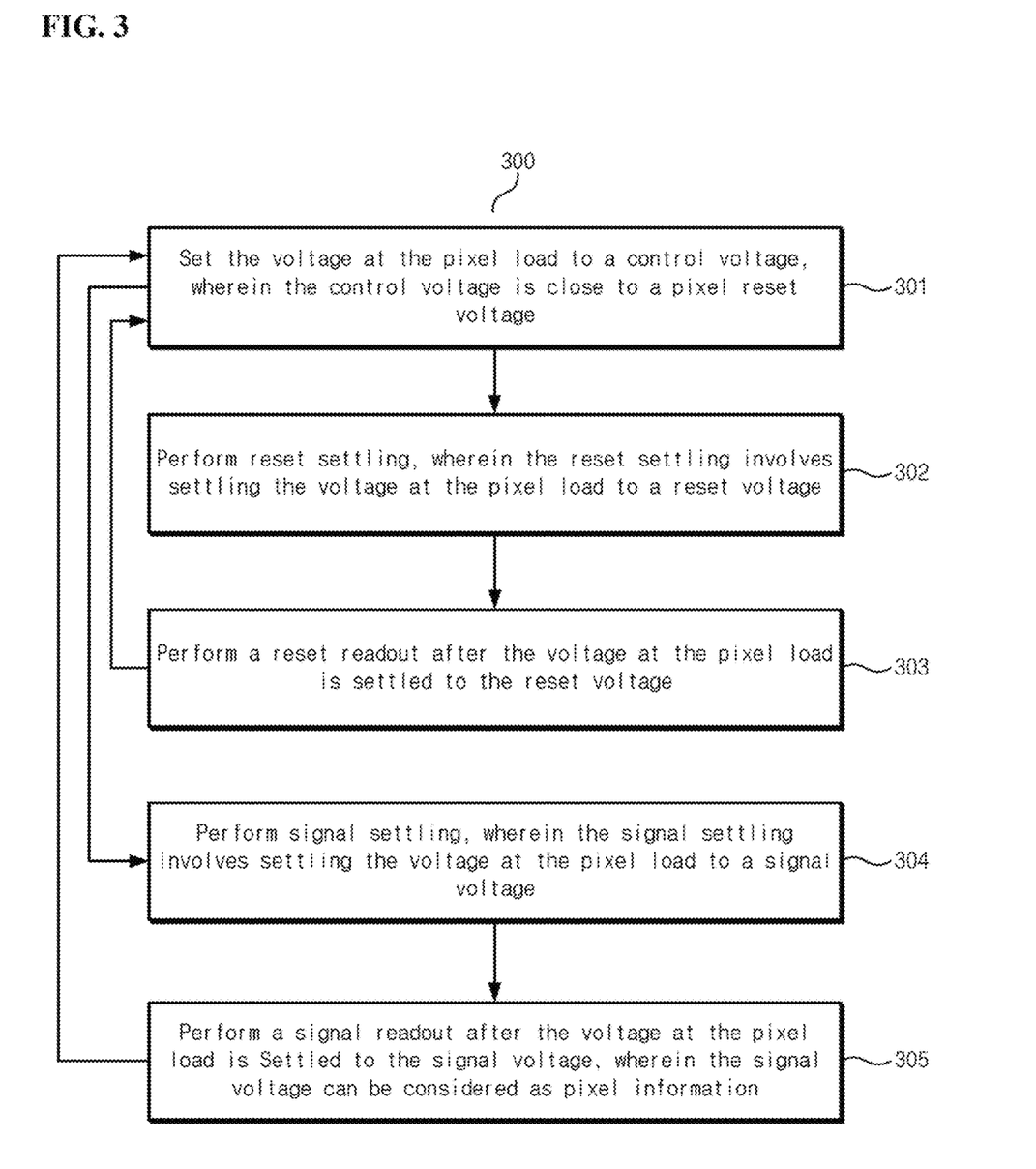
FIG. 3 depicts a plurality of stages involved in a cycle comprising reset readout and signal readout operations, according to some example embodiments of the inventive concepts.

Referring now to the drawings, and more particularly to FIG. 2 and FIG. 3, where similar reference characters denote corresponding features consistently throughout the figures, there are shown some example embodiments.

FIG. 2 illustrates a Complementary Metal Oxide Semiconductor (CMOS) Image Sensor (CIS) 200 that includes a pixel circuit 201, a VSL circuit 204, and an amplifier 208 (also referred to herein as an amplifier circuit). FIG. 2 depicts a Correlated Double Sampling (CDS) column of a Complementary Metal Oxide Semiconductor (CMOS) Image Sensor (CIS) 200, which is coupled with an amplifier 208 and a source follower, wherein the amplifier 208 provides a configurable voltage to enable pixel load voltage to closely track a pixel reset voltage, according to some example embodiments of the inventive concepts. As depicted in FIG. 2, the CDS column is connected to a pixel circuit 201 and a VSL circuit 204. The pixel circuit 201 comprises a first Metal Oxide Semiconductor (MOS) transistor 202 and a second MOS transistor 203. The VSL circuit 204 comprises a third MOS transistor 205, a fourth MOS transistor 206. The VSL circuit 204 is connected to pixel load 207. In some example embodiments, the pixel load 207 can be a current source. In some example embodiments, the amplifier 208 can be an Operational Trans-conductance Amplifier (OTA). The source follower, connected to the output of the amplifier 208 and the gate terminal of the third MOS transistor 205, comprises a fifth MOS transistor 209 and a sixth MOS transistor 210.

The second MOS transistor 203, the fourth MOS transistor 206, and the sixth MOS transistor 210 act as switches. The supply voltage connected to the first MOS transistor 202, the third MOS transistor 205, and the fifth MOS transistor 209 is VPIX. The supply voltage provided to the amplifier 208 is VCP, which is 2*VDDA, wherein VPIX is equal to VDDA. A magnitude of a voltage provided by a power supply connected to the amplifier 208 (e.g., VCP) may be about twice a magnitude of a voltage provided by a power supply connected to the pixel circuit 201 (e.g., VPIX). In some example embodiments, the supply voltage provided to the amplifier 208 can be obtained using a charge pump voltage doubler circuit (not shown). The input voltage provided to the charge pump voltage doubler circuit can be VDDA, and the output voltage of the charge pump voltage doubler circuit is VCP (2*VDDA). This enables the amplifier 208 to generate an output voltage, which can be greater than the supply voltage connected to the first MOS transistor 202.

The supply voltage of the amplifier 208 is greater than that of the pixel circuit 201 (first MOS transistor 202) and the VSL circuit 204 (third MOS transistor 205). This can ensure that the voltage at the pixel load 207 can track a pixel reset voltage. The pixel reset voltage is a voltage, which is dependent on the supply voltage of the first MOS transistor 202 and a gate-source voltage of the first MOS transistor 202 when no signal is applied at the input terminal or gate terminal (labelled as FD) of the first MOS transistor 202. When no signal is applied at the input terminal or gate terminal of the first MOS transistor 202, the voltage at the gate terminal of the first MOS transistor 202 is VPIX. Therefore, the pixel reset voltage will be VPIX−VGS1. The VGS1 is the gate-source voltage of the first MOS transistor 202. In an example, if VPIX is 2.8 Volts and VGS1 is 0.35 Volts, then the pixel reset voltage will be 2.45 Volts.

The positive input terminal of the amplifier 208 is connected to a variable resistor. The voltage at the positive input terminal of the amplifier 208 is VDDA−I*R, wherein the 'I' is the current flowing through the variable resistor and 'R' is the resistance. The value of 'R' can be configured based on requirement (track the pixel reset voltage). In an example, I*R can be configured in a range of 0.2-1.2 Volts. As the amplifier 208 is an OTA, the voltage at the negative input terminal of the amplifier 208 is also VDDA−I*R (due to the virtual ground principle). The voltage at the output terminal of the amplifier 208 is VDDA−I*R+VGS5, if the sixth MOS transistor 210 is turned ON. The VGS5 is the gate-source voltage of the fifth MOS transistor 209. The voltage at the output of the fifth MOS transistor 209 is VDDA−I*R+VGS5 (labelled as VSL_AMPO).

The voltage VSL_AMPO is provided at the input (gate) terminal of the third MOS transistor 205. If the second MOS transistor 203 is turned OFF, the pixel circuit cannot read the voltage at the input (gate) terminal of the first MOS transistor 202. If the fourth MOS transistor 206 is turned ON while the while the second MOS transistor 203 is turned OFF, the voltage at the pixel load 207 will be VSL_AMPO−VGS3. The VGS3 is the gate-source voltage of the third MOS transistor 205. The voltage VSL-AMPO−VGS3 can be considered as a control voltage. The value of I*R can be configured to ensure that the control voltage (VDDA−I*R+VGS5−VGS3) follows or closely tracks the pixel reset voltage.

In an example, if VDDA is 2.8 Volts (considering VPIX to be 2.8 Volts as previous), VGS5 is 0.7 Volts, and VGS3 is 0.7 Volts, then the control voltage can be configured in the range of 2.6-1.6 Volts. Therefore, if the pixel reset voltage is 2.45 Volts, 'R' can be configured such that I*R is close to 0.35 Volts. This ensures that the control voltage is 2.45 Volts. Thus, the control voltage or voltage at the pixel load 207 tracks the pixel reset voltage (2.45 Volts) when the second MOS transistor 203 is turned OFF and the fourth MOS transistor 206 is turned ON.

Further, there can be variations in the pixel reset voltages corresponding to variations in the pixel circuit 201. The variations in the pixel circuit 201 can affect the gate-source voltage of the first MOS transistor 202 VGS1. The gate-source voltages can vary across MOS transistors due to varying threshold voltages VTH. When there is variation in the gate-source voltage of the first MOS transistor 202, there is variation in the pixel reset voltage. The configurability of the control voltage allows tolerating variations amongst pixel circuits (201) as the control voltage can be configured to closely track a particular pixel reset voltage.

The gate terminal of the first MOS transistor 202 is connected to a photodiode (not shown), and thus the pixel circuit 201 may include or may be configured to implement the functionality of the photodiode. The photodiode can convert light (e.g., incident light) captured by a pixel (represented by the pixel circuit 201) into charge. This charge is stored in a parasitic capacitance at the gate terminal of the first MOS transistor 202. The charge stored in the parasitic capacitor corresponds to a voltage, which depends on the capacitance of the parasitic capacitor. The voltage is considered as the signal voltage at the gate terminal of the first MOS transistor 202. The first MOS transistor 202 may be turned ON/OFF based on an intensity of light captured by the photodiode connected to the gate terminal of the first MOS transistor 202, and thus the intensity of light captured by the pixel circuit 201. The photodiode may transfer charge from the light captured by the pixel circuit 201 when (e.g., in response to) the second MOS transistor 203 is turned OFF.

When the second MOS transistor 203 is turned OFF and if no signal is applied at the gate terminal of the first MOS transistor 202, then the voltage at the gate terminal of the first MOS transistor 202 is VPIX. At this stage, the voltage at the pixel load 207 is set to the control voltage value. When a reset readout phase is initiated, the second MOS transistor 203 is turned ON. At this stage, the voltage at the pixel load 207 needs to reach to VPIX−VGS1. The voltage VPIX−VGS1 can be considered as reset voltage. The voltage at the pixel load 207 needs to settle to VPIX−VGS1 from the control voltage (VDDA−I*R+VGS5−VGS3). Considering the example wherein VPIX is 2.8 Volts and VGS1 is 0.35 Volts. Then the reset voltage (VPIX−VGS1) is 2.45 Volts.

As the control voltage is set to the pixel reset voltage (in this case the pixel reset voltage is equal to the reset voltage) and the control voltage is approximately equal to pixel reset voltage across process and temperature, the time involved in settling the voltage at the pixel load 207 to the reset voltage (2.45 Volts) from the control voltage (2.45 Volts) will be significantly lower and settling can be achieved using lower Pixel Load Current. This can greatly reduce the power consumption and help in increasing the frame rate. Once the voltage at the pixel load 207 is settled to the reset voltage, the reset readout operation can be performed. This involves reading the voltage at the pixel load 207. This completes the reset readout phase and the second MOS transistor 203 is turned OFF. The voltage at the pixel load again settles to the control voltage.

At this stage, a signal is applied at the gate terminal of the first MOS transistor 202. The application of the signal refers to the capturing of light by the pixel circuit 201 (photodiode at the gate terminal of the first MOS transistor 202). When light is captured by the photodiode, charge is generated. Accordingly, the photodiode is configured to generate charge based on incident light captured by the pixel circuit 201 and transfer the generated charge to the parasitic capacitor at the gate terminal of the first MOS transistor 202, The amount of charge generated depends on the intensity of light (e.g., incident light) captured by the pixel (pixel circuit 201). If the pixel is a dark pixel, i.e., light falling on the photodiode is very low; the charge generated will be low. On the other hand, if the pixel is a bright pixel, i.e., high intensity light falls on the photodiode; the charge generated will be high.

The generated charge is stored in the parasitic capacitor at the gate terminal of the first MOS transistor 202. The charge stored in the parasitic capacitor corresponds to a voltage, wherein the voltage depends on the capacitance of the parasitic capacitor. In some example embodiments, the voltage can vary in the range 0-0.95 Volts. If the voltage is 0 or close to 0, then it indicates that the pixel is a dark pixel. Similarly, if the voltage is 0.95V or close to 0.95V, then it indicates that the pixel is a bright pixel. The charge stored in the parasitic capacitor at the gate terminal of the first MOS transistor 202 may be a difference of charge stored in the parasitic capacitor when the voltage at the gate terminal of the first MOS transistor 202 is the voltage provided by the power supply connected to the pixel circuit 201 and the charge generated by the photodiode from the light captured by the pixel circuit 201.

Before the signal is applied at the gate terminal of the first MOS transistor 202 (and during the reset readout phase), the voltage at the gate terminal of the first MOS transistor 202 was VPIX. The application of the signal causes a change in the voltage at the gate terminal of the first MOS transistor 202. Considering the example, wherein VPIX is 2.8 Volts, the voltage at the gate terminal of the first MOS transistor 202 can vary in the range of 2.8-1.85 Volts.

At this stage, the voltage at the pixel load 207 is set to the control voltage value. When a signal readout phase is initiated, the second MOS transistor 203 is turned ON. At this stage, the voltage at the pixel load 207 needs to reach to VG1−VGS1 (e.g., signal voltage). The voltage VG1 is the voltage at the gate terminal of the first MOS transistor 202. Considering that VG1 can vary in the range of 2.8-1.85 Volts, the voltage VG1−VGS1 can vary in the range of 2.45-1.6 Volts. The voltage VG1−VGS1 can be considered as signal voltage. The voltage at the pixel load 207 needs to settle to VG1−VGS1 from the control voltage (VDDA−I*R+VGS5−VGS3). If the control voltage is 2.45 Volts, then the output of a bright pixel needs to settle (from 2.45 Volts) at 1.6 Volts and the output of the dark pixel needs to settle (from approximately 2.45 Volts) at 2.45 Volts. The darker pixels may require lesser time to settle, compared to the brighter pixels. The pixel information may be stored in the pixel load 207 when the voltage at the pixel load 207 settles to the signal voltage.

During Analog to Digital conversion of signal voltage, the pixel output is connected to one input terminal of a comparator. The other input terminal of the comparator is connected to a Ramp Voltage. In CMOS Image sensors, the Ramp voltage is designed to have a negative slope, i.e. the Ramp voltage starts at a higher voltage and gradually reduces value at each clock cycle. This profile of the Ramp Voltage allows the darker pixels to be converted to digital codes earlier than the bright pixels, since the darker pixels have higher magnitudes of voltage. The signal readout (i.e. Analog to Digital Conversion of signal voltage) can be initiated after the darker pixels have settled to their respective values. Hence, the signal settling time is determined by the time required for a dark pixel to settle from a control voltage to signal voltage.

The amplifier circuit provides a control voltage to PIX_OUT, which is approximately equal to the signal voltage of the darker pixels. This enables achieving pixel settling at lower current in a shorter time period during signal phase. Signal readout involves reading the voltage (signal voltage) at the pixel load 207. After the signal readout phase is completed, the second MOS transistor 203 is turned OFF. The voltage at the pixel load 207 settles to the control voltage.

Accordingly, the CIS 200 may be further configured to read the voltage at the pixel load 207 when (e.g., in response to) the voltage at the pixel load 207 has reached either the reset voltage or the signal voltage. The CIS 200 may switch OFF the second MOS transistor 203 after (e.g., in response to, subsequent to, etc.) reading the voltage at the pixel load 207. The voltage at the pixel load 207 may reach the control voltage when (e.g., in response to) the second MOS transistor 203 is switched OFF.

Similarly, pixel information corresponding to a plurality of pixel circuits (201) in the CIS 200 can be determined in parallel. The plurality of pixel circuits (201) represents the plurality of pixel columns of a pixel row of an image/frame. Once the pixel information corresponding to the plurality of pixel circuits (201) is determined, a subsequent row is selected and the pixel information corresponding to a plurality of pixel circuits (201) are determined in parallel. In this manner, the pixel information corresponding to all pixels of the image/frame are determined. In an example, for a 64 mega-pixel camera, there can be approximately 7200 pixel rows and 9300 pixel columns. Therefore, the pixel information corresponding to the rows can be determined serially, wherein for each pixel row, the pixel information corresponding to the columns in the selected pixel row can be determined in parallel.

Referring to FIG. 2, the settling the voltage at the pixel load 207 to either the reset voltage or the signal voltage by the VSL circuit 204 may include switching ON the second MOS transistor 203, switching OFF the fourth MOS transistor 206, and enabling the voltage at the pixel load 207 to reach either the reset voltage or the signal voltage, from a control voltage, wherein the control voltage is generated based on a gate-source voltage (e.g., VGS3) of the second MOS transistor 203, a gate-source voltage (e.g., VGS5) of a fifth MOS transistor 209 connected to an output of the amplifier 208, and the voltage (e.g., configurable voltage) generated by the amplifier 208 (e.g., is VDDA−I*R+VGS5).

Referring to FIG. 2, the pixel circuit 201 may be configured to generate a reset voltage (e.g., VPIX−VGS1) and a signal voltage (e.g., VG1−VGS1), based on at least one of a power supply connected to the pixel circuit 201 (e.g., based on the supply voltage VPIX to the pixel circuit 201) or an intensity of light captured by the pixel circuit 201 (e.g., an intensity of light captured by a photodiode connected to the gate of the first MOS transistor 202). Still referring to FIG. 2, the VSL circuit 204 may be configured to perform at least one of storing pixel information in a pixel load 207 based on settling a voltage at the pixel load 207 to the signal voltage (e.g., VG1−VGS1), or setting the voltage at the pixel load 207 to a pixel reset voltage based on settling the voltage at the pixel load to the reset voltage (VPIX−VGS1). Still referring to FIG. 2, the amplifier 208 may be configured to generate a voltage (e.g., a configurable voltage, which may be configured based on varying a resistance of an input of the amplifier 208, for example a variable resistor) to enable the VSL circuit 204 to perform at least one of storing the pixel information, or setting the voltage at the pixel load to the pixel reset voltage, wherein the generated voltage is configured based on varying a resistance at an input of the amplifier 208. The reset voltage and the signal voltage may be generated in response to the second MOS transistor 203 being switched OFF. The reset voltage may be a difference of a voltage at a gate terminal of the first MOS transistor 202 (e.g., VPIX) and a gate-source voltage of the first MOS transistor 202 (e.g., VGS1), and the voltage at the gate terminal of the first MOS transistor 202 (e.g., VPIX) may be a voltage provided by the power supply connected to the pixel circuit 201. The signal voltage may be a difference of a voltage at a gate terminal of the first MOS transistor 202 (e.g., VG1) and a gate-source voltage of the first MOS transistor 202 (e.g., VGS1), and the voltage at the gate terminal of the first MOS transistor 202 (VGS1) may be based on a charge stored in a parasitic capacitor at the gate terminal of the first MOS transistor 202 and a capacitance of the parasitic capacitor.

In some example embodiments, any devices, image sensors, and/or portions thereof according to any of the example embodiments, and/or any portions thereof (including, without limitation, the CIS 200, a device including the CIS 200, or any portion thereof) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of the image sensor, including the functionality and/or methods performed by some or all of any devices, image sensors, and/or portions thereof according to any of the example embodiments, and/or any portions thereof (including, without limitation, the CIS 200, a device including the CIS 200, or any portion thereof).

FIG. 3 depicts a method 300 including a plurality of stages (also referred to herein as operations) involved in a cycle comprising reset readout and signal readout operations, according to some example embodiments of the inventive concepts. The operations illustrated in FIG. 3 may be implemented by a CIS (e.g., the CIS 200 shown in FIG. 2) and/or one or more portions thereof. At stage 301, the voltage at the pixel load 207 is set to the control voltage, wherein the control voltage is close to a pixel reset voltage. At stage 302, reset settling can be performed, wherein the reset settling involves settling the voltage at the pixel load 207 to a reset voltage. At stage 303, a reset readout operation is performed after the voltage at the pixel load is settled to the reset voltage. Thereafter the voltage at the pixel load 207 is set to the control voltage (stage 301). At stage 304, signal settling can be performed, wherein signal settling involves settling the voltage at the pixel load 207 to a signal voltage. At stage 305, a signal readout operation is performed after the voltage at the pixel load 207 is settled to the signal voltage. The voltage at the pixel load, when the voltage at the pixel load has settled to the signal voltage, can be considered as pixel information.

The various actions in each of the plurality of stages are performed in the order presented. Further, in some embodiments, some actions listed in FIG. 3 may be omitted or there might be more stages which are not listed here.

In some example embodiments, for a 64 mega-pixel CIS having 1PL/1Col architecture, the inclusion of the amplifier can reduce the power consumption of the CIS by approximately 13 milliwatts. This can be useful for image sensors in mobile devices or smart phones. Alternatively, the frame rate of the CIS can improve by 10% without consumption of additional power. This can be useful for image sensors in cameras used for surveillance cameras and driverless vehicles. In two-stacked mobile image sensors, the pixel circuit can be an Active Pixel Sensor (APS), which can be considered as top chip and the ADC can be considered as part of the bottom chip. The process technology of the top chip can be different from the process technology of the bottom chip. Since the amplifier can support a wide range of pixel reset voltages (1.6-2.6 Volts), the CIS can support multiple APS chips without any modification. For example, if a new CIS is designed with a new APS and if the bottom chip is reused, the variable resistance can be tuned to support the pixel reset voltage level of the new APS.

For a 64 mega-pixel CIS without the amplifier 208, if the current at the pixel load 207 is maintained at 2.5 µA, the 1-H time period (comprising of reset readout and signal readout phases) is 7 µs. However, if the 64 mega-pixel CIS includes the amplifier 208 and if the current at the pixel load 207 is maintained at 2.5 µA, the 1-H time period is 6.3 µs. Therefore, the inclusion of the amplifier 208 in the CIS reduces the 1-H time by 10%. This leads to an increase in frame rate by 10%.

For a 64 mega-pixel CIS without the amplifier 208, if the number of pixel loads 207 in the CIS is 9328 the current at each pixel load 207 needs to be maintained at 2.5 µA. Therefore, the total pixel load 207 current will be 23.32 mA (0.0025*9328). The power consumption of the pixel load will be 65.3 mW. The 1-H time period is 7 us microseconds. However, if the 64 mega-pixel CIS includes the amplifier 208 and if the number of pixel loads 207 in the CIS is 9328, the same frame rate (7 µs) can be achieved if the current at each pixel load 207 is maintained at 2 µA. Therefore, the total pixel load 207 current will be 18.656 mA (0.002*9328). The power consumption of the pixel load will be 52.24 mW. This reduces the power consumption by approximately 13 mW or 20%.

Some example embodiments disclosed herein provide an amplifier circuit (and/or a CIS including the amplifier circuit) for generating a configurable voltage, which allows ensuring that voltages at individual pixel loads of an image sensor closely track a pixel reset voltage, wherein the tracking enables reducing power consumption involved in pixel settling and increasing the frame rate of the image sensor by reducing pixel settling time. Therefore, it is understood that the scope of the protection is extended to such a program and in addition to a computer readable means having a message therein, such computer readable storage means contain program code means for implementation of one or more steps of the method, when the program runs on a server or mobile device or any suitable programmable device. The method (e.g., method 300) is implemented in some example embodiments through or together with a software program written in example Very high speed integrated circuit Hardware Description Language (VHDL), or any other programming language, or implemented by one or more VHDL or several software modules being executed on at least one hardware device. The hardware device can be any kind of portable device that can be programmed. The device may also include means, which could be, for example, a hardware means, for example, an Application-specific Integrated Circuit (ASIC), or a combination of hardware and software means, for example, an ASIC and a Field Programmable Gate Array (FPGA), or at least one microprocessor and at least one memory with software modules located therein. The method embodiments described herein could be implemented partly in hardware and partly in software. Alternatively, the inventive concepts may be implemented on different hardware devices, e.g. using a plurality of Central Processing Units (CPUs).

The foregoing description of the specific embodiments will so fully reveal the general nature of some example embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while some example embodiments herein have been described with regard to the drawings, those skilled in the art will recognize that some example embodiments herein can be practiced with modification within the scope of some example embodiments as described herein.

We claim:

1. A Complementary Metal Oxide Semiconductor (CMOS) Image Sensor (CIS), the CIS comprising:
   a pixel circuit, wherein the pixel circuit is configured to generate a reset voltage and a signal voltage, based on at least one of
      a power supply connected to the pixel circuit, or
      intensity of light captured by the pixel circuit;
   a VSL circuit, wherein the VSL circuit is configured to perform at least one of
      storing pixel information in a pixel load based on settling a voltage at the pixel load to the signal voltage, or
      setting the voltage at the pixel load to a pixel reset voltage based on settling the voltage at the pixel load to the reset voltage; and
   an amplifier, wherein the amplifier is configured to generate a voltage to enable the VSL circuit to perform at least one of
      storing the pixel information, or
      setting the voltage at the pixel load to the pixel reset voltage,
   wherein the generated voltage is configured based on varying a resistance at an input of the amplifier.

2. The CIS of claim 1, wherein
   the pixel circuit comprises a first Metal Oxide Semiconductor (MOS) transistor and a second MOS transistor, and
   the reset voltage and the signal voltage are generated in response to the second MOS transistor being switched OFF.

3. The CIS of claim 2, wherein
   the reset voltage is a difference of a voltage at a gate terminal of the first MOS transistor and a gate-source voltage of the first MOS transistor, and
   the voltage at the gate terminal of the first MOS transistor is a voltage provided by the power supply connected to the pixel circuit.

4. The CIS of claim 2, wherein
   the signal voltage is a difference of a voltage at a gate terminal of the first MOS transistor and a gate-source voltage of the first MOS transistor, and
   the voltage at the gate terminal of the first MOS transistor is based on a charge stored in a parasitic capacitor at the gate terminal of the first MOS transistor and a capacitance of the parasitic capacitor.

5. The CIS of claim 4, wherein
   the pixel circuit includes a photodiode,
   the photodiode is configured to generate charge based on incident light captured by the pixel circuit and transfer the generated charge in the parasitic capacitor, and
   an amount of charge generated from the incident light is based on the intensity of the light captured by the pixel circuit.

6. The CIS of claim 5, wherein the charge stored in the parasitic capacitor at the gate terminal of the first MOS transistor is a difference of charge stored in the parasitic capacitor when the voltage at the gate terminal of the first MOS transistor is the voltage provided by the power supply connected to the pixel circuit and the charge generated by the photodiode from the light captured by the pixel circuit.

7. The CIS of claim 5, wherein the photodiode is configured to transfer charge from the light captured by the pixel circuit in response to the second MOS transistor being turned OFF.

8. The CIS of claim 1, wherein
   the pixel information is stored in the pixel load when the voltage at the pixel load settles to the signal voltage, and
   the pixel load is a current source.

9. The CIS of claim 2, wherein
   the VSL circuit comprises a third MOS transistor and a fourth MOS transistor, and
   settling the voltage at the pixel load to either the reset voltage or the signal voltage by the VSL circuit includes
      switching ON the second MOS transistor,
      switching OFF the fourth MOS transistor, and
      enabling the voltage at the pixel load to reach either the reset voltage or the signal voltage, from a control voltage, wherein the control voltage is generated based on a gate-source voltage of the third MOS transistor, a gate-source voltage of a fifth MOS transistor connected to an output of the amplifier, and the voltage generated by the amplifier.

10. The CIS of claim 9, wherein the CIS is further configured to read the voltage at the pixel load when the voltage at the pixel load has reached either the reset voltage or the signal voltage.

11. The CIS of claim 10, wherein
    the CIS is further configured to switch OFF the second MOS transistor after reading the voltage at the pixel load, and
    the voltage at the pixel load reaches the control voltage when the second MOS transistor is switched OFF.

12. The CIS of claim 9, wherein the control voltage is configured to be about equal to the pixel reset voltage.

13. The CIS of claim 1, wherein a magnitude of a voltage provided by a power supply connected to the amplifier is about twice a magnitude of a voltage provided by the power supply connected to the pixel circuit.

* * * * *